(12) United States Patent
Lee

(10) Patent No.: US 9,438,215 B2
(45) Date of Patent: Sep. 6, 2016

(54) BUFFER CIRCUIT FOR BUFFERING AND SETTLING INPUT VOLTAGE TO TARGET VOLTAGE LEVEL AND OPERATION METHOD THEREOF

(71) Applicant: SK hynix Inc., Gyeonggi-do (KR)

(72) Inventor: Myung-Hwan Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 98 days.

(21) Appl. No.: 14/498,623

(22) Filed: Sep. 26, 2014

(65) Prior Publication Data

US 2015/0263711 A1 Sep. 17, 2015

(30) Foreign Application Priority Data

Mar. 11, 2014 (KR) .................. 10-2014-0028317

(51) Int. Cl.
*H03K 5/02* (2006.01)
*H03K 5/24* (2006.01)

(52) U.S. Cl.
CPC .............. *H03K 5/02* (2013.01); *H03K 5/2481* (2013.01)

(58) Field of Classification Search
CPC ........................... H03K 5/02; H03K 5/2481
USPC .................... 327/108; 330/260, 261
See application file for complete search history.

(56) References Cited

U.S. PATENT DOCUMENTS

| 5,196,807 | A | * | 3/1993 | Fujisawa | H03F 1/0261 330/136 |
| 5,362,992 | A | * | 11/1994 | Wile | H03K 5/1532 327/58 |
| 7,049,857 | B2 | * | 5/2006 | Styduhar | H03K 3/3565 327/63 |

FOREIGN PATENT DOCUMENTS

| KR | 100753151 | 8/2007 |
| KR | 100951668 | 4/2010 |

* cited by examiner

*Primary Examiner* — Kenneth B Wells
(74) *Attorney, Agent, or Firm* — IP & T Group LLP

(57) ABSTRACT

A buffer circuit includes an amplifying unit suitable for comparing an input voltage of an input terminal with an output voltage of an output terminal, a current sinking unit suitable for controlling a sinking current of the amplifying unit when the input voltage is varied, and a current compensation unit suitable for uniformly maintaining a sinking current amount of the current sinking unit.

17 Claims, 2 Drawing Sheets

BUFFER CIRCUIT FOR BUFFERING AND SETTLING INPUT VOLTAGE TO TARGET VOLTAGE LEVEL AND OPERATION METHOD THEREOF

CROSS-REFERENCE TO RELATED APPLICATIONS

The present application claims priority of Korean Patent Application No. 10-2014-0028317, and filed on Mar. 11, 2014, which is incorporated herein by reference in its entirety.

BACKGROUND

1. Field

Various embodiments of the present invention relate to a buffer circuit and an operation method thereof.

2. Description of the Related Art

Recently, a technical trend of a semiconductor device is concentrated on a low power operation. Various proposals have been introduced to reduce a standby current of internal circuits of a semiconductor device to achieve low power operation. For example, a plurality of buffer circuits may be included in the semiconductor device. Moreover, reducing a current consumption of the buffer circuits may lead to a low power operation of the semiconductor device.

In general, a two-stage amplifier is used as a buffer circuit. Since the two-stage amplifier has a two-pole configuration, it is needed to secure a phase margin more than 60 degrees for frequency stability. Additionally, since a load capacitance coupled to an output terminal of the buffer circuit is relatively large, the load capacitance of the buffer circuit has an influence on the phase margin. To optimize the phase margin of the buffer circuit according to a position of a pole of an input node and a pole of an output node, an amount of sinking current of the two-stage amplifier is adjusted using a bias applied from an external device.

Furthermore, a voltage level of an external voltage such as a power supply voltage, is linearly increased from 0 V to a target voltage level. A semiconductor device activates a power-up signal and initiates an operation thereof when the external voltage reaches the target voltage level. During the power-up of the semiconductor device, a conventional buffer circuit may not uniformly maintain a charge amount corresponding to the load capacitance. Due to a coupling effect, an output voltage of the buffer circuit is increased compared to an input voltage thereof.

When a sinking current amount of the buffer circuit is reduced due to a low power operation, a discharge time for discharging an output terminal of the buffer circuit may be delayed, that is, a settling time of the buffer may be increased. The settling time represents a time in which the output voltage of the buffer circuit reaches a target voltage level.

SUMMARY

Various embodiments of the present invention are directed to a buffer circuit that may prevent an output settling time from increasing by a low power operation and improve stability.

In accordance with an embodiment of the present invention, a buffer circuit includes an amplifying unit suitable for comparing an input voltage of an input terminal with an output voltage of an output terminal; a current sinking unit suitable for controlling a sinking current of the amplifying unit when the input voltage is varied; and a current compensation unit suitable for uniformly maintaining a sinking current amount of the current sinking unit.

In accordance with an embodiment of the present invention, a buffer circuit includes an amplifying unit suitable for comparing an input voltage of an input terminal with an output voltage of an output terminal; a current sinking unit coupled to the input terminal of the amplifying unit and suitable for controlling a sinking current of the amplifying unit when a power-up operation is performed; and a current compensation unit coupled to the output terminal of the amplifying unit and suitable for uniformly maintaining a sinking current amount of the current sinking unit.

In accordance with an embodiment of the present invention, an operation method of a buffer circuit includes comparing an input voltage with an output voltage, which is fed back, to generate an output voltage; and controlling a sinking current amount of the buffer circuit based on a change of the input voltage.

DETAILED DESCRIPTION

Figure 1:
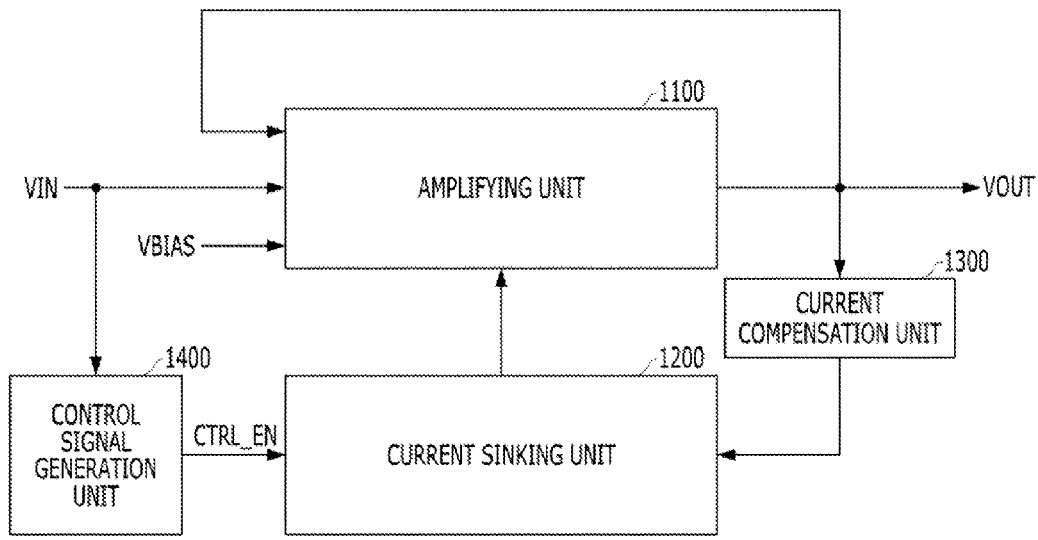
FIG. 1 is a block diagram illustrating a buffer circuit in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated to clearly illustrate features of the embodiments. In this specification, specific terms have been used. The terms are used to describe the present invention, and are not used to qualify the sense or limit the scope of the present invention.

It is also noted that in this specification, "and/or" represents that one or more of components arranged before and after "and/or" is included. Furthermore, "connected/coupled" refers to one component not only directly coupling another component but also indirectly coupling another component through an intermediate component. In addition, a singular form may include a plural form as long as it is not specifically mentioned in a sentence. Furthermore, "include/comprise" or "including/comprising" used in the specification represents that one or more components, steps, operations, and elements exists or are added.

FIG. 1 is a block diagram illustrating a buffer circuit in accordance with an embodiment of the present invention.

Referring to FIG. 1, the buffer circuit may include an amplifying unit 1100, a current sinking unit 1200, a current compensation unit 1300 and a control signal generation unit 1400.

The amplifying unit 1100 compares an input voltage VIN of an input terminal with an output voltage VOUT of an output terminal and amplifies the difference therebetween. The current sinking unit 1200 is coupled to the amplifying unit 1100. The current sinking unit 1200 may control a sinking current of the amplifying unit 1100 when the input voltage VIN is varied. The current compensation unit 1300 is coupled to the output terminal of the amplifying unit 1100, and uniformly maintains a sinking current amount of the current sinking unit 1200.

The buffer circuit may control a sinking current of the amplifying unit 1100 for amplifying the output voltage VOUT to a target voltage level according to the input voltage VIN. That is, the amplifying unit 1100 may control a sinking current at an initial time based on a bias voltage VBIAS applied from an external device. Herein, if the input voltage VIN is varied, the current sinking unit 1200 may further control the sinking current of the amplifying unit 1100 based on a control signal CTRL_EN. The control signal generation unit 1400 generates the control signal CTRL_EN which is activated when the varied input voltage VIN is detected. A settling time for increasing the output voltage VOUT to a target voltage level may be reduced by further controlling the sinking current. However, if the input voltage VIN is varied, a ratio of a sinking current, which is sunk from the current sinking unit 1200, is not constant. If the ratio of the sinking current is not constant, a position of poles of an input terminal and an output terminal of a buffer circuit is changed, and thus a phase margin is deteriorated. Therefore, the current compensation unit 1300 may compensate a sinking current, which is sunk from the current sinking unit 1200, to maintain a constant ratio. The buffer circuit in accordance with an embodiment of the present invention may control the sinking current of the amplifying unit 1100 to correspond to the input voltage VIN when the input voltage VIN is varied. Since the buffer circuit may control a ratio of the sinking current of the output terminal and the input terminal irrespective of a voltage level of the input voltage VIN, the buffer circuit may improve a phase margin according to the input voltage VIN.

Figure 2:
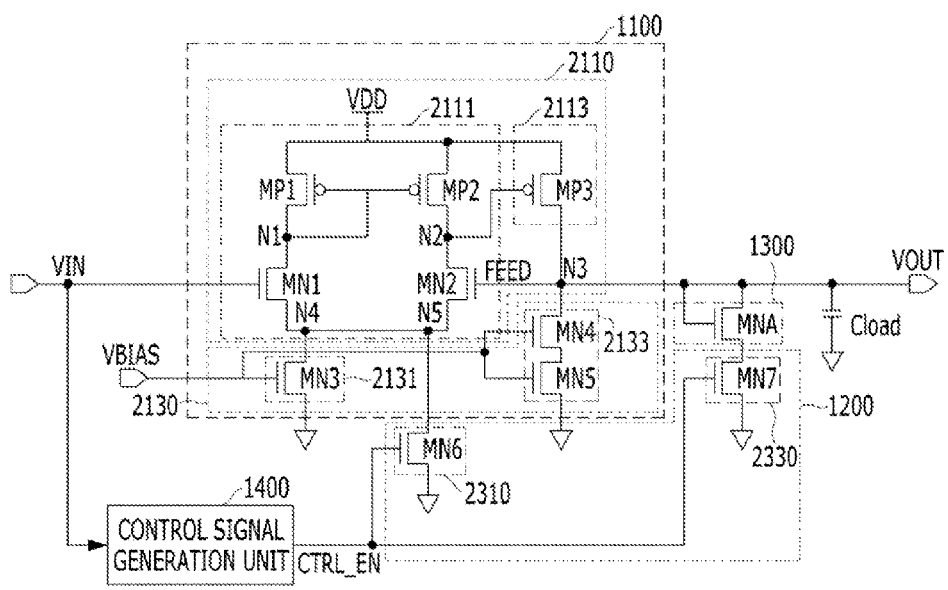
FIG. 2 is a detailed diagram of a buffer circuit shown in FIG. 1.

FIG. 2 is a detailed diagram of the buffer circuit shown in FIG. 1.

Referring to FIG. 2, the amplifying unit 1100 compares an input voltage VIN of the input terminal with an output voltage VOUT of the output terminal, and amplifies the difference therebetween. The amplifying unit 1100 may include a driving unit 2110 and an initial current sinking unit 2130.

The driving unit 2110 may compare the input voltage VIN with the output voltage VOUT and outputs a voltage, which is amplified according to a compared result, as the output voltage VOUT. Specifically, the driving unit 2110 may include a comparison unit 2111, an output unit 2113 and a feedback unit FEED.

The comparison unit 2111 may compare the input voltage VIN with the output voltage VOUT, and include a first PMOS transistor MP1, a second PMOS transistor MP2, a first NMOS transistor MN1 and a second NMOS transistor MN2. The first PMOS transistor MP1 has a source-drain path coupled between a power supply voltage VDD and a first node N1. A gate of the first PMOS transistor MP1 is coupled to the first node N1. The second PMOS transistor MP2 has a source-drain path coupled between the power supply voltage VDD and a second node N2. A gate of the second PMOS transistor MP2 is coupled to the first node N1. The first NMOS transistor MN1 has a source-drain path coupled between the first node N1 and a first initial current sinking unit 2131. The input voltage VIN is inputted to the gate of the first NMOS transistor MN1. The second NMOS transistor MN2 has a source-drain path coupled between the second node N2 and the first initial current sinking unit 2131. A third node N3 is coupled to a gate of the second NMOS transistor MN2.

The output unit 2113 outputs the output voltage VOUT, which is amplified in response to an output signal outputted from the comparison unit 2111. The output unit 2113 may have a third PMOS transistor MP3. The third PMOS transistor MP3 has a source-drain path coupled between the power supply voltage VDD and the third node N3. The output signal outputted from the comparison unit 2111 is inputted to a gate of the third PMOS transistor MP3.

The feedback unit FEED may provide a voltage level corresponding to the output voltage VOUT outputted from the output unit 2113. Although the feedback unit FEED includes a transmission line for transferring a feedback voltage from the third node N3 to the second NMOS transistor MN2, in another embodiment, another transistor may be further configured.

The initial current sinking unit 2130 is driven in response to a bias voltage VBIAS applied from an external device and may control a sinking current of the driving unit 2110. The initial current sinking unit 2130 includes a first initial current sinking unit 2131 and a second initial current sinking unit 2133. The first initial current sinking unit 2131 of the initial current sinking unit 2130 is coupled to the comparison unit 2111 and may control the sinking current of the comparison unit 2111. That is, the first initial current sinking unit 2131 may sink a current from a fourth node N4 coupled between the first initial current sinking unit 2131 and the comparison unit 2111. The first initial current sinking unit 2131 may include the third NMOS transistor MN3. The third NMOS transistor MN3 has a source-drain path coupled between the comparison unit 2111 and a ground voltage VSS. The bias voltage VBIAS is applied to the gate of the third NMOS transistor MN3.

The second initial current sinking unit 2133 is coupled to the output unit 2113 and may control a sinking current. The second initial current sinking unit 2133 may sink the current from the third node N3 coupled between the second initial current sinking unit 2133 and the output unit 2113. The second initial current sinking unit 2133 may include a fourth NMOS transistor MN4 and a fifth NMOS transistor MN5. The fourth NMOS transistor MN4 and the fifth NMOS transistor MN5 are coupled in series between the third node N3 and the ground voltage VSS. The fourth transistor MN4 and the fifth transistor MN5 may receive the bias voltage VBIAS through a gate.

The control signal generation unit 1400 may generate a control signal CTRL_EN, which is activated when the input voltage VIN is changed. The control signal generation unit 1400 may include a detection circuit for receiving the input voltage VIN and detecting a state of the input voltage VIN. The control signal generation unit 1400 may detect a swing state of the input voltage VIN.

The current sinking unit 1200 may include a first current sinking unit 2310 and a second current sinking unit 2330. The current sinking unit 1200 may control a sinking current of the amplifying unit 1100 in response to the control signal CTRL_EN. The first current sinking unit 2310 is coupled to the comparison unit 2111 and may control the sinking current of the comparison unit 2111. That is, the first current sinking unit 2310 may control the sinking current corresponding to the input voltage VIN of the input terminal.

The first current sinking unit 2310 may sink the current from a fifth node N5 coupled between the first current sinking unit 2310 and the comparison unit 2111. The first current sinking unit 2310 may include a sixth NMOS transistor MN6. The sixth NMOS transistor MN6 has a source-drain path coupled between the comparison unit 2111 and a ground voltage VSS terminal, and receives the control signal CTRL_EN through a gate thereof. The second current sinking unit 2330 is coupled to the current compensation unit 1300 and may control the sinking current of the output terminal. The second current sinking unit 2330 may include a seventh NMOS transistor MN7. The seventh NMOS transistor MN7 has a source-drain path between the current compensation unit 1300 and the ground voltage VSS terminal, and receives the control signal CTRL_EN through a gate thereof.

The current compensation unit 1300 is coupled to the output terminal of the amplifying unit 1100, and may uniformly maintain a sinking current amount of the current sinking unit 1200. The current compensation unit 1300 may include a driving transistor MNA, which is controlled by the output voltage VOUT of the output terminal. The driving transistor MNA may have a same size as the first NMOS transistor MN1 for receiving the input voltage VIN of the amplifying unit 1100. The driving transistor MNA is coupled between the second current sinking unit 2330 and the output terminal. A gate of the driving transistor MNA is coupled between the third node N3 and the output terminal.

Since the driving transistor MNA included in the current compensation unit 1300 has the same size as the first NMOS transistor MN1, a drain-source voltage $V_{DS}$ of the seventh NMOS transistor MN7 for controlling the sinking current of the output terminal is the same as a drain-source voltage $V_{DS}$ of the sixth NMOS transistor MN6 for controlling the sinking current of the input terminal. Thus, the buffer circuit uniformly maintains a ratio of the sinking current corresponding to the output voltage VOUT and the sinking current corresponding to the input voltage VIN although the input voltage VIN is varied. Furthermore, a load capacitor Cload coupled to the output terminal denotes a modeled value of a load capacitance of the output terminal.

The input voltage VIN and the bias voltage VBIAS are applied to input terminals of the amplifying unit 1100. The third to fifth NMOS transistors MN3 to MN5 are turned on according to the bias voltage VBIAS, and the sinking current of the comparison unit 2111 is controlled. A voltage difference between the input voltage VIN and the voltage of the third node N3 is provided to the output unit 2113, and the third PMOS transistor MP3 is turned on. Thus, the amplified output voltage VOUT is outputted to the third node N3. The control signal CTRL_EN is activated when the input voltage VIN is varied. The sixth NMOS transistor MN6 and the seventh NMOS transistor MN7 are turned on in response to the control signal CTRL_EN. The seventh transistor MN7 is coupled to the driving transistor MNA having the same size as the first NMOS transistor MN1. Thus, the ratio of the current which is sunk from the first initial current sinking unit 2131, and the current, which is sunk from the second initial current sinking unit 2133 may be uniformly maintained. An input voltage VIN of the buffer circuit may rapidly reach to the target voltage level by further controlling the sinking current in response to the control signal CTRL_EN. Since an interval between the pole of the input terminal and the pole of the output terminal is stably maintained by uniformly maintaining a current sinking ratio of the input terminal and the output terminal, the buffer circuit may stably improve phase margin.

Figure 3:
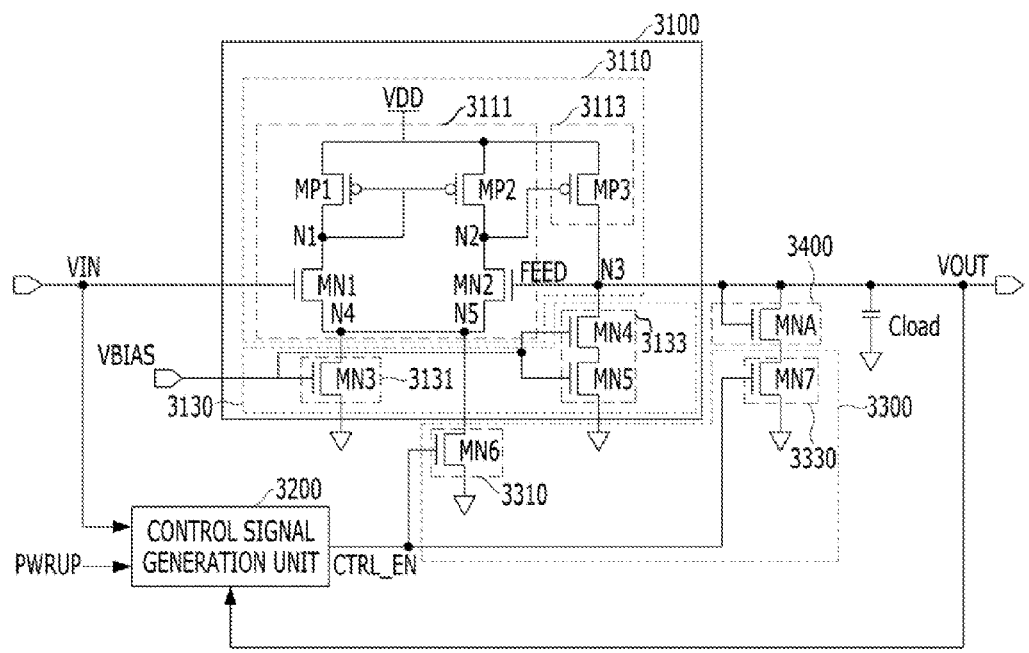
FIG. 3 is a circuit diagram illustrating a buffer circuit in accordance with an embodiment of the present invention.

FIG. 3 is a circuit diagram illustrating a buffer circuit in accordance with an embodiment of the present invention.

Referring to FIG. 3, the buffer circuit may include an amplifying unit 3100, a control signal generation unit 3200, a current sinking unit 3300, a current compensation unit 3400 and an output terminal. The buffer circuit may maintain a current sinking ratio of the input terminal and the output terminal of the buffer circuit when a power-up operation is performed although the input voltage VIN is fixed.

The amplifying unit 3100 compares an input voltage VIN of the input terminal with an output voltage VOUT of the output terminal, and amplifies the difference therebetween. The amplifying unit 3100 may include a driving unit 3110 and an initial current sinking unit 3130.

The driving unit 3110 may compare the input voltage VIN with the output voltage VOUT and outputs a voltage, which is amplified according to a compared result, as the output voltage VOUT. More specifically, the driving unit 3110 may include a comparison unit 3111, an output unit 3113 and a feedback unit FEED.

The comparison unit 3111 may compare the input voltage VIN with the output voltage VOUT, and include a first PMOS transistor MP1, a second PMOS transistor MP2, a first NMOS transistor MN1 and a second NMOS transistor MN2. The first PMOS transistor MP1 has a source-drain path coupled between a power supply voltage VDD and a first node N1. A gate of the first PMOS transistor MP1 is coupled to the first node N1. The second PMOS transistor MP2 has a source-drain path coupled between the power supply voltage VDD and a second node N2. A gate of the second PMOS transistor MP2 is coupled to the first node N1. The first NMOS transistor MN1 has a source-drain path coupled between the first node N1 and a first initial current sinking unit 3131. The input voltage VIN is inputted to the gate of the first NMOS transistor MN1. The second NMOS transistor MN2 has a source-drain path coupled between the second node N2 and the first initial current sinking unit 3131. A third node N3 is coupled to a gate of the second NMOS transistor MN2.

The output unit 3113 outputs the output voltage VOUT, which is amplified in response to an output signal outputted from the comparison unit 3111. The output unit 3113 may have a third PMOS transistor MP3. The third PMOS transistor MP3 has a source-drain path coupled between the power supply voltage VDD and the third node N3. The output signal outputted from the comparison unit 3111 is inputted to a gate of the third PMOS transistor MP3.

The feedback unit FEED may provide a voltage level corresponding to the output voltage VOUT outputted from the output unit 3113. Although the feedback unit FEED includes a transmission line for transferring a feedback voltage from the third node N3 to the second NMOS transistor MN2, in another embodiment, another transistor may be further configured.

The initial current sinking unit 3130 is driven in response to a bias voltage VBIAS applied from an external device and may control a sinking current of the driving unit 3110. The initial current sinking unit 3130 includes a first current sinking unit 3131 and a second initial current sinking unit 3133. The first initial current sinking unit 3131 of the initial current sinking unit 3130 is coupled to the comparison unit 3111 and may control the sinking current of the comparison unit 3111. That is, the first initial current sinking unit 3131 may sink a current from a fourth node N4 coupled between the first initial current sinking unit 3131 and the comparison unit 3111. The first initial current sinking unit 3131 may include the third NMOS transistor MN3. The third NMOS transistor MN3 has a source-drain path coupled between the comparison unit 3111 and a ground voltage VSS. The bias voltage VBIAS is applied to the gate of the third NMOS transistor MN3.

The second initial current sinking unit 3133 is coupled to the output unit 3113 and may control a sinking current. The second initial current sinking unit 3133 may sink the current from the third node N3 coupled between the second current sinking unit 3133 and the output unit 3113. The second initial current sinking unit 3133 may include a fourth NMOS transistor MN4 and a fifth NMOS transistor MN5. The fourth NMOS transistor MN4 and the fifth NMOS transistor MN5 are coupled in series between the third node N3 and the ground voltage VSS. Each of the fourth transistor MN4 and the fifth transistor MN5 may receive the bias voltage VBIAS at its gate.

The control signal generation unit 3200 may receive a power-up signal PWRUP, an input voltage VIN and an output voltage VOUT, and generate a control signal CTRL_EN. The control signal CTRL_EN is activated when the power-up signal PWRUP is applied, and is inactivated when the output voltage VOUT is settled to have the same voltage level as the input voltage VIN. That is, the control signal CTRL_EN may be activated even though the output voltage VOUT is higher than the input voltage VIN under an unstable condition, such as the power-up operation. The detailed descriptions of the control signal generation unit 3200 will follow with reference to FIG. 4.

The current sinking unit 3300 may include a first current sinking unit 3310 and a second current sinking unit 3330. The current sinking unit 3300 may control a sinking current of the amplifying unit 3100 when the power-up operation is performed. The first current sinking unit 3310 is coupled to the comparison unit 3111 and may control the sinking current of the comparison unit 3111. That is, the first current sinking unit 3310 may control the sinking current corresponding to the input voltage VIN of the input terminal.

The first current sinking unit 3310 may sink the current from a fifth node N5 coupled between the first current sinking unit 3310 and the comparison unit 3111. The first current sinking unit 3310 may include a sixth NMOS transistor MN6. The sixth NMOS transistor MN6 has a source-drain path coupled between the comparison unit 3111 and a ground voltage VSS terminal, and receives the control signal CTRL_EN as its gate terminal. The second current sinking unit 3330 is coupled to the current compensation unit 3400 and may control the sinking current of the output terminal. The second current sinking unit 3330 may include a seventh NMOS transistor MN7. The seventh NMOS transistor MN7 has a source-drain path between the current compensation unit 3400 and the ground voltage VSS terminal, and receives the control signal CTRL_EN through a gate thereof.

The current compensation unit 3400 is coupled to the output terminal of the amplifying unit 3100, and may uniformly maintain a sinking current amount of the current sinking unit 3300. The current compensation unit 3400 may include a driving transistor MNA, which is controlled by the output voltage VOUT of the output terminal. The driving transistor MNA may have a same size as the first NMOS transistor MN1 for receiving the input voltage VIN of the amplifying unit 3100. The driving transistor MNA is coupled between the second current sinking unit 3330 and the output terminal. A gate of the driving transistor MNA is coupled between the third node N3 and the output terminal.

Since the driving transistor MNA included in the current compensation unit 3400 has the same size as the first NMOS transistor MN1, a drain-source voltage $V_{DS}$ of the seventh NMOS transistor MN7 for controlling the sinking current of the output terminal is the same as a drain-source voltage $V_{DS}$ of the sixth NMOS transistor MN6 for controlling the sinking current of the input terminal. A load capacitor Cload coupled to the output terminal denotes a modeled value of a load capacitance of the output terminal.

The input voltage VIN and the bias voltage VBIAS are applied to input terminals of the amplifying unit 3100. The third to fifth NMOS transistors MN3 to MN5 are turned on according to the bias voltage VBIAS, and the sinking current of the comparison unit 3111 is controlled. A voltage difference between the input voltage VIN and the voltage of the third node N3 is provided to the output unit 3113, and the third PMOS transistor MP3 is turned on. Thus, the amplified output voltage VOUT is outputted to the third node N3. The control signal generation unit 3200 may generate the control signal CTRL_EN when the power-up signal PWRUP is received or the output voltage VOUT is higher than the input voltage VIN under the unstable condition excluding the power-up operation. The sixth NMOS transistor MN6 and the seventh NMOS transistor MN7 are turned on in response to the control signal CTRL_EN, which is activated. The seventh transistor MN7 is coupled to the driving transistor MNA having the same size as the first NMOS transistor MN1. Thus, the first current sinking unit 3310 for controlling the sinking current corresponding to the input voltage VIN of the input terminal and the second current sinking unit 3330 for controlling the sinking current corresponding to the output voltage VOUT of the output terminal may uniformly maintain the ratio of the sinking current irrespective of the voltage level of the input voltage VIN. When the power-up operation is performed, and an external power supply voltage VDD is applied, the unstable condition may occur. That is, after the power-up operation is performed, as a charge amount of the load capacitor Cload coupled to the output terminal is not constant, and is increased accordingly as the external power supply voltage VDD is increased, the output voltage VOUT may be increased. The buffer circuit may reduce a settling time by further controlling the sinking current in response to the control signal CTRL_EN when the power-up signal PWRUP is activated or the output voltage VOUT is higher than the input voltage VIN. Moreover, the buffer circuit may stably improve the phase margin by uniformly maintaining the current sinking ratio of the input terminal and the output terminal.

Figure 4:
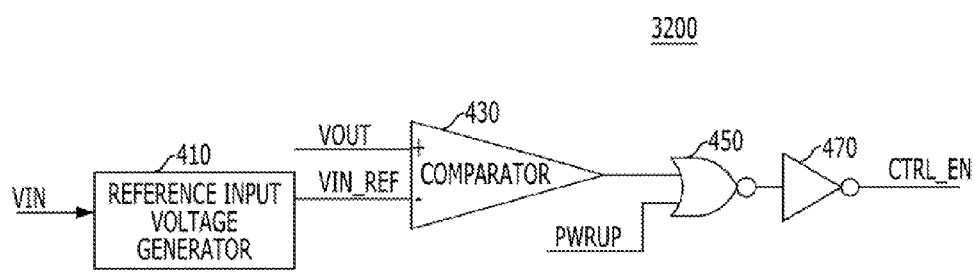
FIG. 4 is a detailed diagram of a control signal generation unit shown in FIG. 3.

FIG. 4 is a circuit diagram of the control signal generation unit 3200 shown in FIG. 3.

Referring to FIG. 4, the control signal generation unit 3200 may include a reference input voltage generator 410, a comparator 430, a NOR gate 450 and an inverter 470.

The reference input voltage generator 410 receives the input voltage VIN, and generates a reference input voltage VIN_REF by increasing a voltage level of the input voltage VIN.

The comparator 430 compares the output voltage VOUT with the reference input voltage VIN_REF, and outputs a logic high level when the voltage level of the output voltage VOUT is equal to or greater than the voltage level of the reference input voltage VIN_REF. The power-up signal PWRUP and an output signal of the comparator 430 are inputted to the NOR gate 450. An output signal of the NOR gate 450 is inputted to the inverter 470 and inverted to output the control signal CTRL_EN. That is, when the power-up signal PWRUP having the logic high level is applied, or the output signal of the comparator 430 has the logic high level, the control signal CTRL_EN is activated.

The buffer circuit compares the output voltage, which is fedback, with the input voltage and generates an amplified voltage as the output voltage. The buffer circuit may control the sinking current of the output terminal according to the change of the input voltage during the power-up operation or the change of the input voltage.

While the present invention has been described with respect to the specific embodiments, it will be apparent to those skilled in the art that various changes and modifications may be made without departing from the spirit and scope of the invention as defined in the following claims.

What is claimed is:

1. A buffer circuit, comprising:
   an amplifying unit suitable for comparing an input voltage of an input terminal with an output voltage of an output terminal;
   a current sinking unit suitable for controlling a sinking current of the amplifying unit when the input voltage is varied;
   a current compensation unit suitable for uniformly maintaining a sinking current amount of the current sinking unit; and
   a control signal generation unit suitable for receiving the input voltage to generate a control signal, which is activated when the input voltage is varied,
   wherein the current sinking unit is controlled by the control signal.

2. The buffer circuit of claim 1, wherein the current sinking unit comprises:
   a first current sinking unit suitable for controlling the sinking current of the input terminal of the amplifying unit; and
   a second current sinking unit coupled to the current compensation unit and suitable for controlling the sinking current of the output terminal of the amplifying unit.

3. The buffer circuit of claim 1, wherein the control signal generation unit includes a detection circuit suitable for detecting a state of the input voltage.

4. The buffer circuit of claim 1, wherein the amplifying unit comprises:
   a driving unit suitable for comparing the output voltage of the output terminal with the input voltage of the input terminal and outputting a voltage, which is amplified according to a compared value, as the output voltage; and
   an initial current sinking unit suitable for being driven based on a bias voltage applied from an external device.

5. The buffer circuit of claim 4, wherein the driving unit comprises:
   a comparison unit suitable for comparing the output voltage with the input voltage;
   an output unit suitable for outputting the output voltage, which is amplified based on an output signal outputted from the comparison unit; and
   a feedback unit suitable for providing a voltage level corresponding to the output voltage outputted from the output unit to the comparison unit.

6. The buffer circuit of claim 5, wherein the initial current sinking unit comprises:
   a first initial current sinking unit coupled to the comparison unit and suitable for controlling the sinking current of the comparison unit; and
   a second initial current sinking unit coupled to the output unit and suitable for controlling the sinking current of the output unit.

7. The buffer circuit of claim 1, wherein the current compensation unit includes a driving transistor, which is controlled by the output voltage of the output terminal.

8. The buffer circuit of claim 7, wherein the driving transistor has a same size as a transistor for receiving the input voltage.

9. A buffer circuit, comprising:
   an amplifying unit suitable for comparing an input voltage of an input terminal with an output voltage of an output terminal;
   a current sinking unit coupled to the input terminal of the amplifying unit and suitable for controlling a sinking current of the amplifying unit when a power-up operation is performed;
   a current compensation unit coupled to the output terminal of the amplifying unit and suitable for uniformly maintaining a sinking current amount of the current sinking unit; and
   a control signal generation unit suitable for receiving the input voltage, the output voltage and a power-up signal, which is activated during the power-up operation, to generate a control signal activated during the power-up operation,
   wherein the current sinking unit is controlled by the control signal.

10. The buffer circuit of claim 9, wherein the current sinking unit comprises:
    a first current sinking unit suitable for controlling the sinking current of the input terminal of the amplifying unit; and
    a second current sinking unit coupled to the current compensation unit and suitable for controlling the sinking current of the output terminal of the amplifying unit.

11. The buffer circuit of claim 9, wherein the control signal generation unit includes a level comparison unit suitable for comparing the voltage level of the output voltage with a reference input voltage, which is generated by increasing the input voltage by a predetermined level, and generating the control signal based on the output signal outputted from the level comparison unit or the power-up signal.

12. The buffer circuit of claim 9, wherein the amplifying unit comprises:
    a driving unit suitable for comparing the output voltage of the output terminal with the input voltage of the input terminal to output the output voltage; and
    an initial current sinking unit suitable for being driven based on a bias voltage applied from an external device.

13. The buffer circuit of claim 12, wherein the driving unit comprises:
    a comparison unit suitable for comparing the output voltage with the input voltage;
    an output unit suitable for outputting the output voltage, which is amplified based on an output signal outputted from the comparison unit; and
    a feedback unit suitable for providing a voltage level corresponding to the output voltage outputted from the output unit to the comparison unit.

14. The buffer circuit of claim 12, wherein the initial current sinking unit comprises:
    a first initial current sinking unit coupled to the comparison unit and suitable for controlling the sinking current of the comparison unit; and a second initial current sinking unit coupled to the output unit and suitable for controlling the sinking current of the output unit.

15. The buffer circuit of claim 9, wherein the current compensation unit includes a driving transistor, which is controlled by the output voltage of the output terminal.

16. The buffer circuit of claim 15, wherein the driving transistor has the same size as a transistor for receiving the input voltage.

17. The buffer circuit of claim 9, wherein the input voltage is a fixed voltage.

* * * * *